United States Patent [19]
Magdo et al.

[11] 3,894,891
[45] July 15, 1975

[54] METHOD FOR MAKING A SPACE CHARGE LIMITED TRANSISTOR HAVING RECESSED DIELECTRIC ISOLATION

[75] Inventors: Ingrid E. Magdo; Steven Magdo, both of Hopewell Junction, N.Y.

[73] Assignee: International Business Machines Corporation, Armonk, N.Y.

[22] Filed: May 28, 1974

[21] Appl. No.: 473,989

Related U.S. Application Data

[62] Division of Ser. No. 428,165, Dec. 26, 1973, Pat. No. 3,855,609.

[52] U.S. Cl. .................................. 148/1.5; 148/187
[51] Int. Cl. .............................................. H01l 7/34
[58] Field of Search ........ 148/1.5, 187, 175; 357/22

[56] References Cited

UNITED STATES PATENTS

| | | | |
|---|---|---|---|
| 3,701,198 | 10/1972 | Glinski | 148/175 X |
| 3,755,012 | 8/1973 | George et al. | 148/187 X |
| 3,840,886 | 10/1974 | Ashar et al. | 357/22 |

*Primary Examiner*—L. Dewayne Rutledge
*Assistant Examiner*—J. M. Davis
*Attorney, Agent, or Firm*—Robert J. Haase

[57] ABSTRACT

A space charge limited transistor formed on a high resistivity substrate of at least 10,000 ohm-centimeter silicon of one conductivity type. One surface of the substrate is provided with spaced recessed oxide regions. The alternate spaces between the oxide regions are occupied by impurity zones of said one conductivity type. The intervening alternate spaces between the oxide regions are occupied by impurity zones of the other conductivity type. The impurity concentrations of the aforesaid impurity zones are at least several orders of magnitude higher than that of the substrate where the zones are separated from each other by the aforesaid oxide regions. The dielectric relaxation time is much larger than the carrier transit time within the substrate below and between adjacent impurity zones of the same conductivity type.

9 Claims, 13 Drawing Figures

METHOD FOR MAKING A SPACE CHARGE LIMITED TRANSISTOR HAVING RECESSED DIELECTRIC ISOLATION

This is a division of application Ser. No. 428,165, filed Dec. 26, 1973, now U.S. Pat. No. 3,855,609.

FIELD OF THE INVENTION

The present invention generally relates to space charge limited transistors and, more particularly, to a transistor of such type adapted for the elimination of parasitic bipolar transistor action.

DESCRIPTION OF THE PRIOR ART

Copending patent application Ser. No. 209,233 filed Dec. 17, 1971, in the names of Kanu Ashar et al. for "Microampere Space Charge Limited Transistor," and assigned to the present assignee, now U.S. Pat. No. 3,840,886, discloses a space charge limited transistor essentially comprising two lateral transistors formed in overlying relationship in a high resistivity substrate. The upper transistor is a parasitic lateral bipolar transistor while the lower transistor is the desired lateral space charge limited transistor. In operation, both transistors are cut off at 0 base-emitter bias. As the base-emitter junction becomes increasingly forward biased, space charge limited current is initiated first in the lower transistor. As the forward bias increases to higher values, bipolar transistor action is also initiated in the upper transistor.

Some provision is made for reducing the bipolar transistor action in the upper transistor whereby space charge limited transistor action is maintained at higher forward bias values effectively prolonging the desired high current gain mode attributable to the space charge limited transistor and delaying the onset of the lower current gain mode of the bipolar transistor of the composite double transistor structure. However, to the extent that the undesired parasitic bipolar transistor action is not entirely eliminated, the prior art space charge limited transistor fails to exploit its full potential. In addition, the prior art device including the technique for reducing bipolar transistor action is characterized by relatively large parasitic emitter and collector junction capacitances and linearly graded junction profiles which impede high speed switching operation.

SUMMARY OF THE INVENTION

The structure of the present invention comprises a plurality of spaced recessed oxide regions formed in one surface of a high resistivity substrate of at least 10,000 ohm-centimeter silicon of one conductivity type. The alternate spaces between the oxide regions are occupied by impurity zones of said one conductivity type. The intervening alternate spaces between the oxide regions are occupied by impurity zones of the other conductivity type. The dielectric relaxation time is much larger than the carrier transit time within the substrate below and between adjacent impurity zones of the same conductivity type. The spaced recessed oxide regions eliminate the undesired parasitic lateral bipolar transistors inherent in the prior art space charge limited transistor by eliminating the emitter and base junctions thereof. The result is a space charge limited transistor characterized by higher gains at given base driving currents and faster switching operation as compared to the prior device.

Contacts are made to adjacent impurity zones of the same conductivity type for the application of emitter and collector biasing potentials, respectively. Contact is made to the intervening impurity zone of the other conductivity type for the application of the base biasing potential. The contacted P and N impurity zones, in turn, serve as ohmic contacts to the emitter, base and collector portions of the space charge limited transistor. The emitter base and collector portions, per se, are formed in the nearly intrinsic substrate by the electric fields created by the overlying P and N impurity zones. For example, in the NPN species of the present invention, two adjacent N type impurity zones form enhanced N type regions in the underlying high resistivity substrate creating the emitter and collector portions of the space charge limited transistor, respectively. The intervening P type impurity zone forms an inverted P type region in the underlying high resistivity substrate creating the base portion of the space charge limited transistor. The base separates the emitter and collector by forming electrical junctions between the enhanced N type and inverted P type substrate regions.

In the preferred species of the present invention, recessed oxide regions separate the emitter and base ohmic contacts and separate the base and collector ohmic contacts. Another species employs recessed oxide to separate only the emitter and base ohmic contacts.

DESCRIPTION OF THE PREFERRED EMBODIMENT

Figure 1:
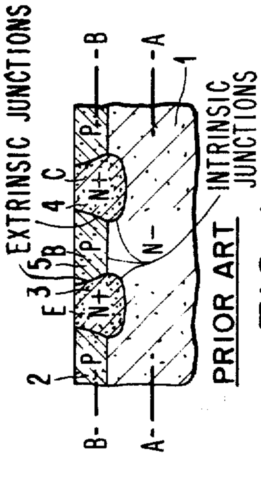
PRIOR ART FIG. 1
FIG. 1 is a cross-sectional view of a prior art NPN space charge limited transistor.

FIG. 1 represents in cross-sectional view a space charge limited transistor constructed in accordance with the teachings of the aforementioned copending Pat. application Ser. No. 209,233. The device comprises a high resistivity $N^-$ substrate 1 of at least 10,000 ohm-centimeter silicon of N conductivity type. One surface of the substrate is provided with an impurity zone 2 of P conductivity type. Spaced N+ diffusions 3 and 4 reach through impurity zone 2 to $N^-$ substrate 1. The dielectric relaxation time is much larger than the carrier transit time through the $N^-$ substrate from N+ region 3 to N+ region 4 whereby space charge limited current flow is achieved upon the establishment of suitable bias conditions. Emitter and collector biasing potentials are applied to N+ regions 3 and 4 and a base biasing potential is applied to P region 5.

The prior art structure comprises two lateral transistors formed in overlying relationship, the upper transistor along plane B—B being a lateral bipolar transistor and the lower transistor along plane A—A being a lateral space charge limited transistor. In operation, both transistors are cut off at zero base-emitter bias. As the base-emitter bias increases, space charge limited current is initiated first along plane AA of the lower transistor. As the forward bias continues to increase, bipolar transistor action is also initiated along plane B—B of the upper transistor. Overall performance is degraded when the parallel-connected bipolar transistor is activated because of the fact that the gain provided by the bipolar transistor is orders of magnitude less than the gain provided by the space charge limited transistor. The performance of the prior art device of FIG. 1 further is impaired by the relatively large capacitance presented by the junctions between N+ emitter 3 and P base 5 and between P base 5 and N+ collector 4 which limit switching speed.

The aforementioned copending patent application includes provision to maintain space charge limited transistor action at higher forward bias values by inhibiting the onset of the lower current gain mode of the bipolar transistor. This is achieved by extending the high resistivity substrate material to the upper surface of the device in the base region between emitter 3 and collector 40. The interruption of the base region by the high resistivity semiconductor material substantially reduces bipolar transistor action enabling space charge limited current action to be extended to higher current levels of the order of one milliampere while also reducing the junction capacitance and increasing the junction breakdown voltage associated with the bipolar transistor. It has been found, however, that the introduction of high resistivity substrate material in the base region of the bipolar transistor does not completely eliminate bipolar transistor action and does not fully exploit the possibility of reducing the junction capacitance and increasing the junction breakdown voltage.

Figure 2:
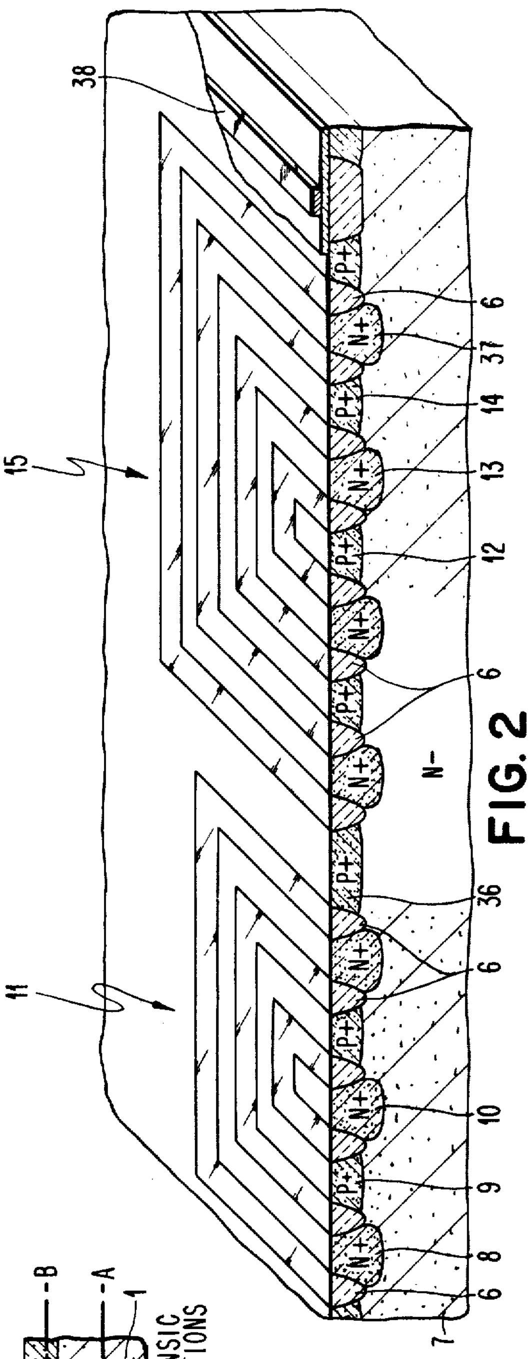
FIGS. 2, 2A, 2B, 2C and 2D are cross-sectional views of a complementary transistor species of the present invention together with partial cross-sectional views of alternative forms that the individual NPN and PNP transistors may take.

The aforementioned desiderata are achieved in the embodiments of the present invention represented in FIG. 2. The recessed oxide structure 6 is formed in a conventional manner, for example, by covering substrate subtrate 7 with a layer of oxidation-masking material such as silicon nitride, opening windows in the nitride where recessed oxide regions are desired, etching the Si, and then oxidizing the resultant structure. Alternatively, grooves can be etched into the substrate where recessed oxide regions are desired and the resultant structure covered with passivating dielectric material without using any oxidation masking material. After oxidation, the nitride masking material is removed and all the indicated $N^+$ and $P^+$ regions including N+ regions 8 and 10 and $P^+$ region 9 are formed, for example, by diffusion, ion implantation, metal alloying or metal sintering techniques. Regions 10, 9 and 8 form the emitter, base and collector, respectively, of NPN transistor 11 whereas regions 12, 13 and 14 form the emitter, base and collector, respectively of PNP transistor 15. $P^+$ region 36 and $N^+$ region 37 isolate transistor 11 from transistor 12. Preferably, the doping level of all of the $N^+$ regions and of all of the $P^+$ regions are of the order of at least $10^{19}$ atoms per cubic centimeter. The $N^+$ and $P^+$ regions are isolated from each other laterally by recessed silicon dioxide regions. The bottom boundaries of the $N^+$ and $P^+$ regions are isolated from each other by the high resistivity substrate 7 which is of the order of at least 10,000 ohm-centimeter (preferably 30,000 ohm-cemtimeter or higher) semiconductor material. It is also preferred that the impurity distributions in both the $N^+$ and $P^+$ regions are such that they form abrupt types of junctions with the substrate. The $N^+$ regions form intrinsic types of "high-low" junctions with $N^-$ substrate 7. The $P^+$ regions form intrinsic types of asymmetric junctions with $N^-$ substrate 7.

Figure 2A:
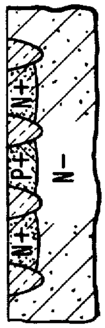
Figure 2B:
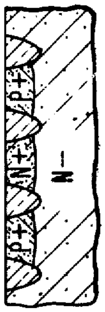
Figure 2C:
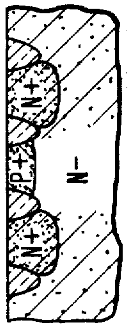
Figure 2D:
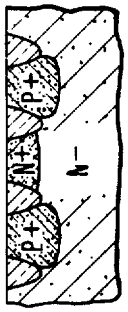

The $N^+$ regions penetrate deeper into substrate 7 than the $P^+$ regions as a result of an optional fabrication technique whereby the $P^+$ diffusions are made in blanket fashion after the recessed oxide regions are formed and the $N^+$ regions are made by diffusing $N^+$ impurities through the blanket $P^+$ layer at the indicated locations. Alternatively, both the $P^+$ and $N^+$ regions may be made by respective masked diffusions in which case the resulting $N^+$ and $P^+$ regions are of uniform depth as shown in FIGS. 2A and 2B representing complementary NPN and PNP transistors, respectively. It also should be observed that an $N^+$ blanket diffusion may precede masked $P^+$ diffusions to yield the PNP device of FIG. 2D. In the event that a blanket diffusion technique is employed yielding $P^+$ and $N^+$ regions of different depths, it is preferred that the deeper-penetrating regions be employed as the emitter and collector of the space charge limited transistor as shown in FIGS. 2, 2C and 2D. The NPN transistor of FIG. 2C is made on the same monolithic substrate with the PNP device of FIG. 2D through the use of four successive diffusions. An advantage of the configuration of the devices of FIGS. 2C and 2D relative to the devices of FIGS. 2A and 2B is that the additional lateral diffusion of the $N^+$ regions of FIG. 2C and of the $P^+$ regions of FIG. 2D reduce the minimum obtainable base width as compared to the devices of FIGS. 2A and 2B where the $N^+$ and $P^+$ region depths are equal to each other.

Figures 3A, 3B:
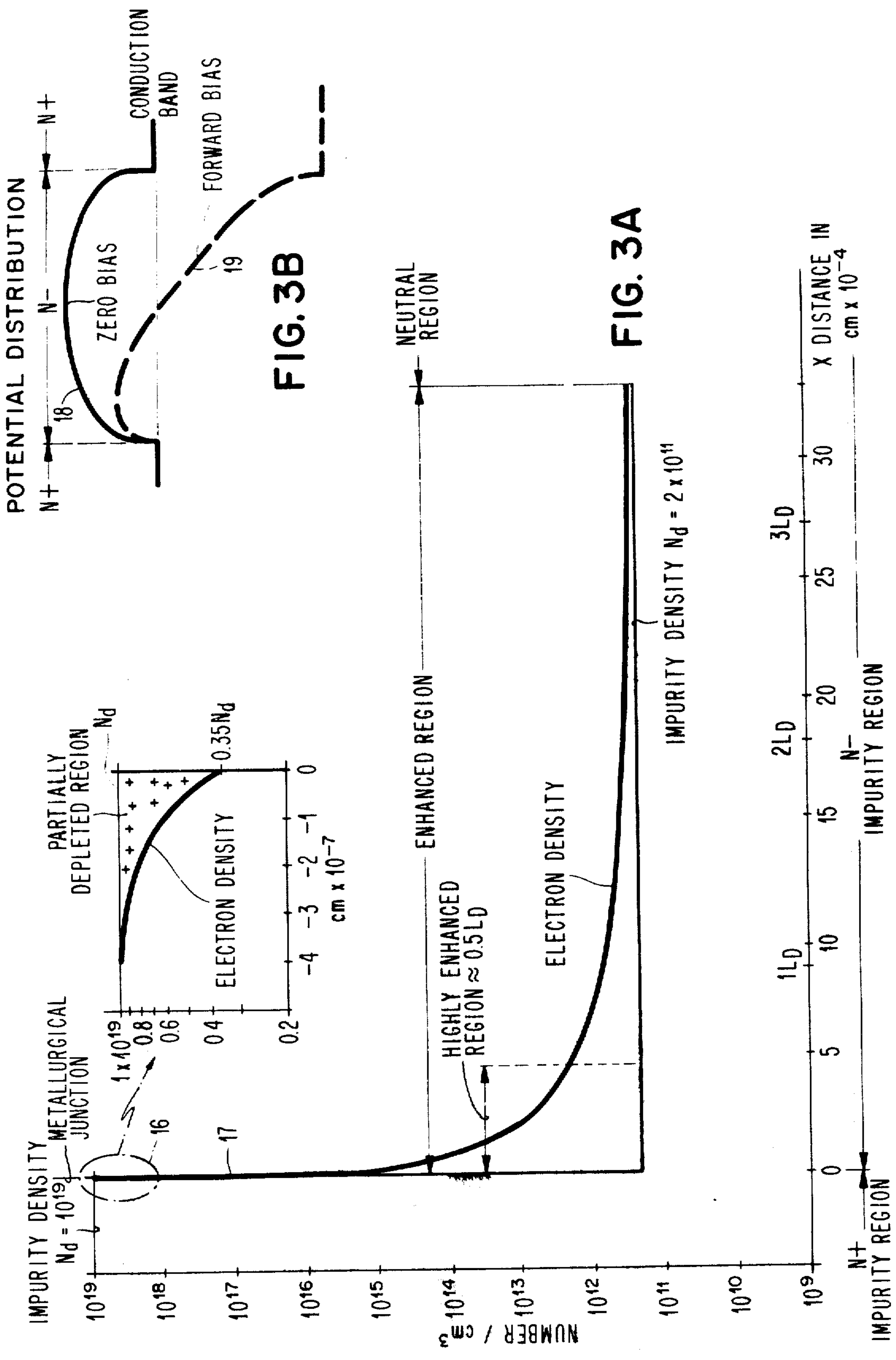
FIGS. 3A and 3B are plots of impurity and charge concentration in an intrinsic type $N^+$-$N^-$ junction versus distance measured from the surface of the device shown in FIG. 2.

FIG. 3A is a plot of impurity and free charge density versus distance into substrate 7 and represents the intrinsic type of abrupt "high-low" junction between any of the $N^+$ regions and the high resistivity $N^-$ substrate 7 assuming thermal equilibrium (zero-current case). It can be seen that electrons diffuse from the high impurity concentration side to the low impurity concentration side of the junction to a depth of about 3 Debey lengths to form an enhanced N type region. As shown by the insert which is an enlargement of the region 16 of the plot 17, a partial depletion region of positive ions is formed on the highside of the junction. This partially depleted region maintains electrical balance with the diffused electrons. The free electron density on the low side exhibits a maximum at the metallurgical junction, the density decreasing rapidly with distance away from said junction. The highly enhanced region, where the electron density is at least an order of magnitude higher than its thermal equilibrium value, is about 0.5 Debey length in depth. The maximum free electron density is about 0.35 $N_d$, where $N_d$ is the impurity concentration on the high side of the junction. The potential distribution of the high-low junction (for the zero-current case) is shown by solid curve 18 of FIG. 3B. When the high-low junction is forward biased (positive voltage being applied to the low side), the potential distribution is modified as shown by dotted curve 19.

In the forward biased case (current-carrying case), a portion of the positive charges in the partially depleted region is cancelled and a corresponding portion of free electrons on the low side of the junction is released. At the same time, positive charges equal in number to the cancelled positive charges appear at the contact on the low side of the junction and attract the released electrons. Thus, an electron current starts to flow from the high-low junction to the bias contact on the low side of the junction. It should be noted that the repelling force between the moving electrons forms a potential depression or minimum which limits the flow of current. In other words, the current is space charge limited in accordance with the Mott-Gurney law and is proportional to $V^2/d^3$ where V is the applied voltage and d is the distance from the metallurgical high-low junction to the bias contact on the low side of the junction.

In the cases of the NPN devices of FIGS. 2, 2A and 2C, the bias contact to the low side of the high-low junction is a second "high-low" (N− to N+) junction completing a total N+ to N− to N+ structure. Said structure has no rectifying properties since a high-low junction is basically an ohmic contact to the conduction band of the $N^-$ high resistivity substrate 7.

Space charge limited current flow in a high-low junction requires that the free electron density be much larger than its compensated density everywhere on the low side. The bias contact on the low side cannot be too far from the metallurgical high-low junction. For very low currents, the electron distribution is approximately the same as shown in FIG. 3A for the zero-current case. Thus, space charge limited current at low current values in a $N^+$ - $N^-$ - $N^+$ structure requires that the width of the $N^-$ region be approximately equal to a Debey length or less. With said width, highly enhanced regions from the two adjacent high-low junctions join each other.

The requirement for space charge limited current flow at high current levels is relaxed somewhat because free electrons move in from the highly enhanced region to the lesser enhanced or neutral regions. It is important, however, that the charge of the electron should not be compensated via dielectric relaxation while in transit through the N- region. In other words, the dielectric relaxation time must be much larger than the carrier transit time. The Debey length ($L_d$) is interrelated with dielectric relaxation time ($\tau$) according to the relationship $L_d=(D_e\ \tau)^{1/2}$ where $D_e$ is the diffusion constant for electrons.

Figure 4:
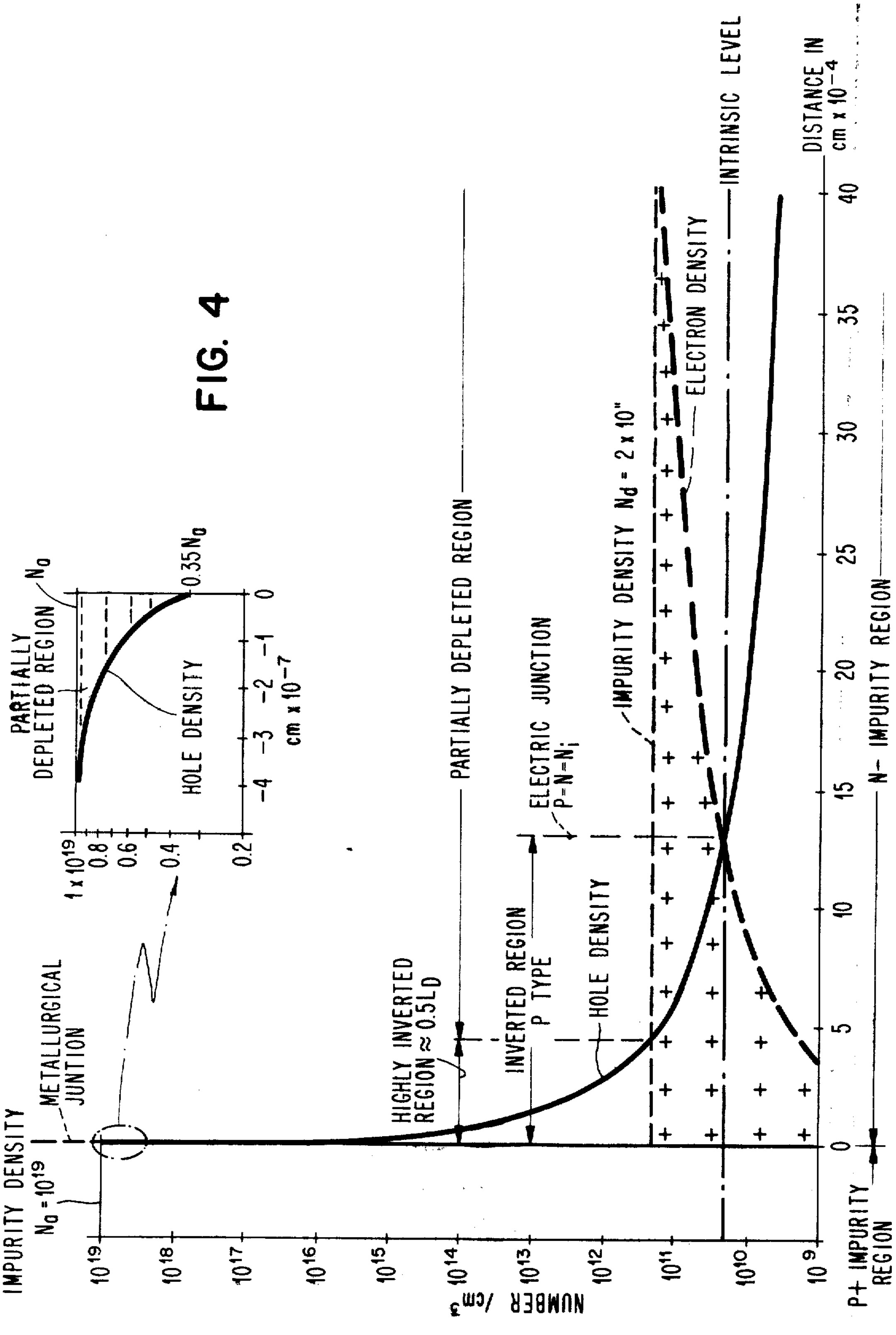
FIG. 4 is a plot of impurity and charge concentration in an intrinsic type $P^+$-$N^-$ junction versus distance measured from the surface of the device of FIG. 2.

FIG. 4 depicts the intrinsic type abrupt asymmetric P - $N^-$ junction at thermal equilibrium (zero-current case). The intrinsic type asymmetric P - $N^-$ junction provides an ohmic contact to the valance band of the $N^-$ substrate 7 while the intrinsic type high-low N+ - $N^-$ junction provides an ohmic contact to the conduction band of the $N^-$ substrate 7. It can be seen from FIG. 4 that holes diffuse from the P side to the $N^-$ side of the junction thus electrically inverting the $N^-$ side into P type. The result is that the electrical junction separates from the metallurgical junction and moves deeply into the $N^-$ region a distance of roughly 1.5 Debey lengths.

The electrical junction is surrounded on both sides with positively charged partially depleted regions as shown. Inasmuch as electrons are depleted in the inverted region, the charge density of holes is enhanced by the charge density of the positive ions. A partially depleted region of negative ions is formed on the P side of the junction. Said partially depleted region maintains electrical balance with the diffused holes and also with the positively charged partially depleted region on the $N^-$ side. The free hole density on the $N^-$ side has a maximum at the metallurgical junction and decreases rapidly with distance away from the metallurgical junction. The highly enhanced region, where the free hole density is larger than the positive ion density, is about 0.5 Debey lengths below the metallurgical junction. The maximum free hole density is about 0.35 $N_a$ where $N_a$ is the impurity concentration on the P side of the junction. The potential distributions for the zero-current case and the current carrying case (not shown) are similar to those of FIG. 3B. The forward current is space charge limited and obeys the Mott-Gurney law. The requirements for space charge limited current for the asymmetric junction is the same as for high-low junctions.

It can be noted from FIGS. 3A and 4 that an intrinsic type of junction is not a junction in the usual sense. First, there is no capacitance associated with the intrinsic junction per se. Additionally, the intrinsic type of junction does not have rectifying characteristics. The forward current of the intrinsic type junction is space charge limited (Mott-Gurney law) and is not exponential as in the usual case. The space charge region on the low side is formed predominately from mobile carriers. No injection takes place; the carriers are released or emitted under forward bias. On the low side, there are no minority and majority carriers. The intrinsic junctions are basically ohmic contacts either to the conduction or to the valance bands of the low side. They resemble the cathode of a vacuum tube having an approximately zero work function.

Figures 5A, 5B, 5C:
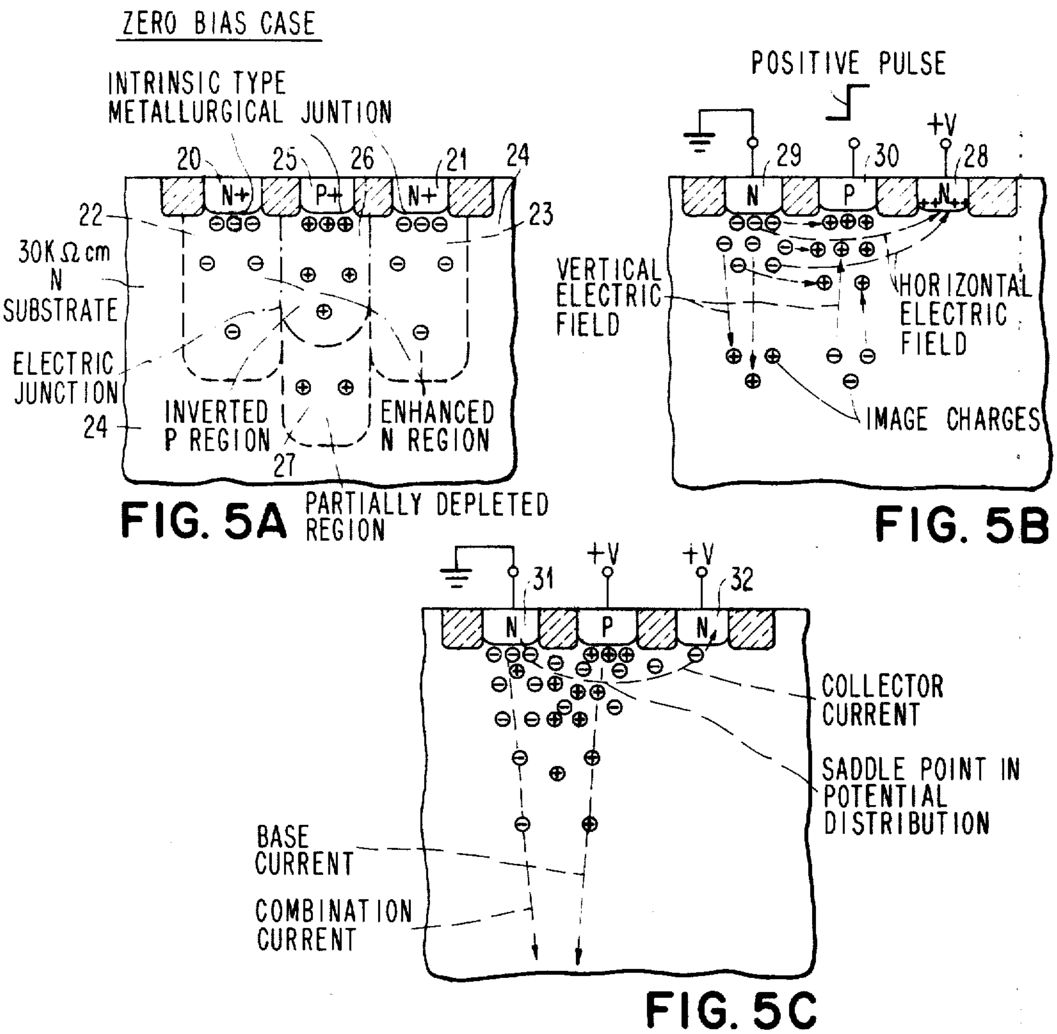
FIGS. 5A, 5B and 5C are a series of cross-sectional views of an NPN embodiment of the present invention under typical biasing conditions.

Referring now to FIG. 5, the operation of a typical NPN space charge limited transistor in accordance with the present invention is depicted under different base bias conditions. FIG. 5A shows the NPN transistor under a zero bias condition. The space charge limited transistor is not formed by P and N impurity regions in a silicon substrate as is the case with the emitter base and collector regions of conventional transistors but is instead formed in a nearly intrinsic region by electric fields created by the presence of N+, P+ and N+ regions above the nearly intrinsic region. The P+ and N+ regions also serve as ohmic contacts. As shown in FIG. 5A, the two N+ regions 20 and 21 produce enhanced N type regions 22 and 23 in the high resistivity substrate 24, regions 22 and 23 comprising the emitter and collector regions, respectively, of the space charge limited transistor.

The P+ region 25 forms an inverted P type region 26 in the substrate creating the base region of the space charge limited transistor. Partially depleted region 27 is formed below inverted P region 26. Base region 26 separates the emitter 22 from the collector 23 by forming electrical junctions between the enhanced N type emitter region 22 and a P type base region 26 and between the enhanced N type collector region 23 and P type base region 26. In the indicated case of zero bias applied to the base region, the aforementioned electrical junctions jointly with the partially depleted region 27 cuts off current flow between emitter 22 and collector 23 in the event that the collector is biased positively with respect to the emitter.

FIG. 5B represents the case where the collector contact 28 is positively biased with respect to the emitter contact 29 and a positive voltage pulse is applied to base contact 30 relative to emitter contact 29. The forward base bias releases a portion of the dense electron and hole concentrations at the metallurgical emitter and base junctions, respectively. The released charges induce opposite polarity image charges in the substrate which give rise to a vertical electric field. At the same time, a horizontal electric field is created in the direction from the emitter to the collector of the space charge limited transistor. The vertical electric field creates a vertical space charge wave which moves both the electrons and holes into the substrate where they recombine with each other. The horizontal electrical field creates a space charge wave moving the electrons toward the collector where the electrons are collected. Since no collecting electrode is provided for the holes, the holes tend to move toward the emitter to partly neutralize the negative space charge created by the electron flow toward the collector. The holes then slowly move to the bulk of the substrate where they eventually recombine, the lifetime of the holes being very high as they travel through the high resistivity substrate material.

FIG. 5C exemplifies the case where the collector current flow reaches the steady state condition after the completion of the turn on transient of FIG. 5B. A horizontal electron current flows from the emitter electrode 31 to the collector electrode 32. This current is space charge limited and the electrons propagate by drift. In addition to the horizontal collector current, a vertical hole and electron current flows toward the substrate where the holes and electrons recombine at a depth of about one ambipolar diffusion length (approximately 100 micrometers). The recombination currents propagate predominately by diffusion because the steady state vertical electric field is quite low. The hole current remains space charge limited because a potential maximum develops in the vertical direction whereas the electron current sees a potential minimum in the horizontal direction (saddlepoint). The vertical hole or base current partly neutralizes the negative space charge in the horizontal electron current. This neutralization is small, in the order of about 1% or less for collector currents in the 10 milliampere range, but it gives rise to an exponential collector current characteristic in the space charge limited transistor as a function of base voltage. The current gain or the collector current to base current ratio is very high because the collector current propagates by drift while the base current propagates by diffusion.

The time required to switch the space charge limited transistor on and off is very short (below about one nanosecond) because the "turn on" and the "turn off" transients of electron and hole currents propagate under the high localized electric fields associated with space charge waves. In addition, since there is no capacitance associated with the intrinsic type of junction, the input and output capacitances of the device are approximately equal to the geometrical capacitances between the $N^+$ and $P^+$ impurity regions which are very low.

It will be noted that in the structural embodiments of FIGS. 2, 2A–2D and 5A–5C, recessed oxide regions are provided between both the N+ and P+ emitter and base contacts, respectively, as well as between the P+ and N+ base and collector contacts, respectively. Significant improvement is achieved with respect to the prior art space charge limited transistor represented by FIG. 1, however, if the recessed oxide region is provided only between the emitter and base contacts. In such an event, it is preferable that the impurity doping level be reduced somewhat in the base contact region to avoid excessively low collector junction breakdown potential that would result if the P+ and N+ base and collector contact regions were contiguous and not separated by a recessed oxide region as shown in the preferred embodiments. The provision of a recessed oxide region solely between the emitter and base contact regions fully eliminates the foward current gain characteristic of the upper lateral bipolar transistor previously discussed in connection with the prior art device of FIG. 1.

In the case of the preferred embodiments where recessed oxide eliminates both the emitter and the collector junction regions of the upper lateral bipolar transistor of the prior art device, there is no longer any reason to limit the impurity concentration in either the N or the P-type ohmic contact regions of the space charge limited transistor.

Figure 6:
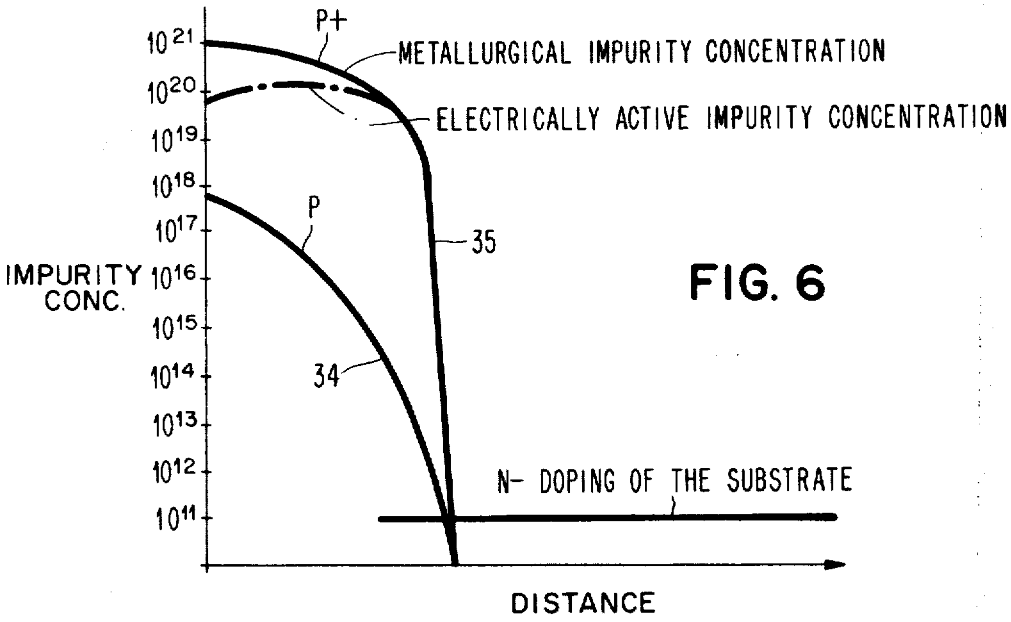
FIG. 6 is a plot of impurity profiles showing the difference between a lineally graded junction and an abrupt junction as used in prior art space charge limited transistors and the present invention, respectively.

FIG. 6 shows the diffusion profiles for $8 \times 10^{17}$ atoms per cubic centimeter and $10^{21}$ atoms per cubic cemtimeter surface concentrations in the P region 5 of the prior art device of FIG. 1 and in the base contact regions respectively, of the preferred embodiments of the present invention. The former profile represented by the curve 34 is lineally graded while the latter profile 35 is an abrupt junction. The sheet resistance associated with curve 34 at the surface is relatively high (approximately 500 ohms per square) and produces very large voltage drops for high base currents. The deeper N+ diffusions 3 and 4 of the prior art device of FIG. 1 must form a lineally graded junction with the substrate in order to avoid punch-through in the relatively lightly doped P region of the lateral bipolar transistor. For the foregoing reasons, the electron and hole emitting capabilities of the intrinsic junctions are reduced in the case of the prior art device of FIG. 1. The consequence is that the space charge waves cannot form during the turn on transients resulting in longer switching time. Switching time in the prior art device also is increased even at low base current levels because of the large capacitances associated with the extrinsic $N^+$ - P junctions which must first be charged up.

It should be noted that the enclosed type geometry (wherein the collector area totally encloses its respective emitter area) employed in the disclosed preferred embodiments can be replaced by striped type geometry upon suitable modification of the mask patterns used in the $N^+$ and $P^+$ diffusion operations. It also should be observed that each of the disclosed devices are fully operative upon the substitution of $P^-$ substrates for the indicated $N^-$ substrates or upon the substitution of $P^+$ diffusions for the indicated $N^+$ diffusions and vice versa together with a reversal of the described operating potentials.

Although oxide isolation is shown in the preferred embodiments for isolating the various impurity zones from each other, other dielectric isolation materials may be substituted. For example, grooves can be etched in the silicon at the locations shown for the recessed oxide regions. The grooves, in turn, optionally can be covered by silicon nitride, pyro oxide, thermal oxide, alumina, etc.

As will be appreciated by those skilled in the art, the complementary space charge limited transistors shown in the preferred embodiments can be interconnected either by metallization or by sharing common impurity regions (not shown) to provide desired circuit functions such as, for example, those of a semiconductor controlled rectifier. It is preferred that interconnecting metallization lines such as line 38 of FIG. 2 between devices be positioned over recessed oxide pathways. The capacitance of the metallization lines is greatly reduced in such a case because there is no appreciable capacitance between the lines and the high resistivity substrate beneath the recessed oxide. The capacitance of each metallization line is only the geometrical capacitance between the line and the impurity zone closest to said recessed oxide.

Although the space charge limited transistors of the present invention have been described in terms of a manufacturing process wherein the recessed dielectric regions are made first and then the $N^+$ and $P^+$ regions are formed, it should be noted that the chronological order of the individual steps is not critical. Alternatively, for example, a P blanket diffusion can be made, followed by selective recessed oxidation, followed by selective N diffusion, or the recessed oxide regions can be made last. Other specific variations will occur to those skilled in the art. In all cases, however, the same advantage is realized, namely, both NPN and PNP transistors are formed without requiring manufacturing steps beyond those necessary to make either type transistor alone.

While this invention has been particularly described with reference to the preferred embodiments thereof, it will be understood by those skilled in the art that the foregoing and other changes in form and details may be made therein without departing from the spirit and scope of the invention.

What is claimed is:

1. A method for simultaneously producing NPN and PNP space charge limited transistors comprising:

providing a high resistivity substrate of at least 10,000 ohm-centimeter semiconductor material, forming spaced recessed dielectric regions extending from said one surface of said substrate into the interior thereof, forming in alternate spaces between said regions first impurity zones of one conductivity type extending from one surface of said substrate into the interior thereof, forming in the intervening alternate spaces between said regions second impurity zones of the other conductivity type extending from said one surface of said substrate to the interior thereof, providing means for electrically biasing two of said first impurity zones and the second impurity zone between said two first impurity zones for transistor operation and, providing means for electrically biasing two of said second impurity zones and the first impurity zone between said two second impurity zones for complementary transistor operation.

2. The method of claim 1 wherein said impurity zones are produced by diffusion.

3. The method of claim 1 wherein said impurity zones are formed by ion implantation.

4. The method of claim 1 wherein said impurity zones are formed by one of alloying and sintering.

5. The method of claim 1 wherein said recessed dielectric regions are formed by recessed oxidation of said substrate.

6. The method of claim 1 wherein said recessed dielectric regions are formed by placing grooves in said one surface of said substrate and covering the surface of said grooves with dielectric material.

7. The method of claim 1 and further forming along interconnection pathways between said transistors another recessed dielectric region extending from said one surface of said substrate into the interior thereof, and placing a metalization line on said another recessed dielectric region.

8. The method of claim 1 wherein said recessed dielectric regions are formed after said first zones are formed.

9. The method of claim 1 wherein said recessed dielectric regions are formed after said first and said second zones are formed.

* * * * *